United States Patent [19]

Picker et al.

[11] 4,054,896

[45] Oct. 18, 1977

[54] SEMICONDUCTOR HETEROJUNCTION TELEVISION IMAGING TUBE

[75] Inventors: Amos Picker, Sharon; Wolfgang M. Feist, Burlington, both of Mass.

[73] Assignee: Raytheon Company, Lexington, Mass.

[21] Appl. No.: 283,252

[22] Filed: Aug. 23, 1972

Related U.S. Application Data

[63] Continuation of Ser. No. 76,920, Sept. 30, 1970.

[51] Int. Cl.[2] ........................ H01L 27/14

[52] U.S. Cl. ........................ 357/31

[58] Field of Search ........................ 357/31, 30

[56] References Cited

U.S. PATENT DOCUMENTS 3,670,213 6/1972 Nakagaw a ........................ 357/31

*Primary Examiner*—Martin H. Edlow

*Attorney, Agent, or Firm*—Richard M. Sharkansky; Milton D. Bartlett; Joseph D. Pannone

[57] ABSTRACT

A display system having a cathode ray tube signal generator in which a solid state junction target utilizes a layer of semiconductor material and a layer of dielectric material to form a junction. The signal generator may be of the monoscope type in which portions of the target are masked or it may be of the photosensitive type in which an image is projected onto the target. A signal derived from the signal generator is displayed on a second cathode ray tube.

23 Claims, 7 Drawing Figures

SEMICONDUCTOR HETEROJUNCTION TELEVISION IMAGING TUBE

This is a continuation of application Ser. No. 76,920 filed Sept. 30, 1970.

REFERENCE TO RELATED CASES

Application Ser. No. 37,552, filed May 15, 1970 by Amos Picker on Junction Target Monoscope and application Ser. No. 19,190, filed Mar. 13, 1970 by Joseph E. Bryden on Visual Display System, both of which are assigned to the same assignee as this application, are hereby incorporated herein by reference.

BACKGROUND OF THE INVENTION

In display systems deriving signals from cathode ray tube signal generators of either the monoscope or the photosensitive camera tube type, targets have been used in which solid state junctions have been formed in materials such as semiconductors by diffusing a junction into the semiconductor. However, this process is often subject to imperfections in the target since in general junctions are formed in slices of semiconductor material grown from a melt and local areas of the slice will have crystal lattice imperfections. Hence during the diffusion process areas of the target where the imperfections occur will have junction regions which operate to produce a lower signal or no signal while regions having little or no such imperfections will produce a higher signal and as a result visually discernable differences can occur when signals generated by such devices are displayed on a display surface such as a cathode ray tube. While it is possible to obtain targets where the size and number of imperfections is small enough to produce usable devices, the resultant increase in production costs makes signal generators using such targets economically unfeasable for many applications.

SUMMARY OF THE INVENTION

This invention provides a signal display system in which overall system complexity is reduced by the use of a cathode ray tube signal generator having a target which produces uniform high level substantially noise free signals across its face. In a light image pickup version of the invention, the target has a semiconductor layer which, on the side thereof exposed to the light, is rendered relatively highly conductive, for example, by overdoping the surface of the semiconductor with the same conductivity type impurity as the remainder of the body. The opposite side of the semiconductor layer has a junction formed therewith by a layer of dielectric material which has a substantially higher bulk resistance than the bulk resistance of said semiconductor layer. As a result, an electron beam scanning the target will charge portions of the layer and these charges will not leak to any substantial degree along the surface of the layer, but will rather pass through the junction in the regions where light impinges on the semiconductor layer. These photogenerated charge carriers migrate to the junction, and will enter the insulator thus discharging the charge on the surface of the dielectric layer.

The area discharged by the impinging light will accept charging electrons from the electron beam during the next scan, whereas those which have not been discharged will reflect the electron beam. The reflected electrons may be picked up and the output signal, represented by the changing amount of reflected electrons, further amplified by a second solid state junction target.

Such a camera device can make use of the substantial increase in conversion of light photons to charge carriers which is possible in a semiconductor body. Since adjacent portions of the target dielectric surface are effectively insulated from each other a high image definition output signal is obtained.

The dielectric layer may be selected from a wide range of materials and can be applied to the semiconductor layer by any of a number of well known processes such as thermal deposition in which the layer is evaporated from a hot source in a vacuum and deposited on a cooler target, by sputtering in a reduced pressure atmosphere, by chemical vapor deposition in which the target is maintained at an elevated temperature and gaseous compounds are directed across the surface of the target to produce a deposition of the desired material by chemical decomposition at the surface of the target, or by oxidization of the semiconductor material. Such processes can be made to produce very uniform layers as well as to substantially reduce junction leakage in those regions of the target where the crystal lattice of the semiconductor has been disturbed during the crystal formation processes or during subsequent processes such as slicing, etching, or other intermediate steps.

In accordance with the invention, a semiconductor layer of material such as silicon may have a relatively low resistance such as 500 ohms per cubic centimeter or less and form a junction with a dielectric material having a resistance many orders of magnitude higher than the semiconductor, for example, $10^8$ to $10^{11}$ ohms per cubic centimeter. In addition, materials may be selected which will enhance the junctions forward to back bias resistance ratio. For example, N doped silicon can be used as the semiconductor substrate with a more heavily doped N type layer on one surface to act as a conductor and to improve photon to carrier conversion efficiency. The opposite side of the semiconductor substrate can have a junction formed thereon by depositing a dielectric layer of, for example, antimony trisulphide which forms a junction with N doped silicon having a high ratio of back bias resistance to forward bias resistance in the absence of photon generated carriers.

The target structures, disclosed herein by way of example, have no individual diode junctions with isolation between them as is the case, for example, in camera tubes having silicon targets whenever hundreds of thousands of individual diodes are separately diffused into the target through apertures in a silicon dioxide layer. Hence, the theoretical limit to the definition which may be achieved by this invention is not limited by the physical separation of discrete diodes, and accordingly definition approaching the limitation imposed by the spot size of the electron scanning beam is possible.

When the target is used in a monoscope, a back bias voltage is applied across the junction through an additional layer having a deposit low resistance compared with said dielectric layer over the dielectric layer. The low resistance layer is selected from materials which will also form a junction with the semiconductor in those regions where imperfections in the dielectric layer might otherwise cause punch through or breakdown of the junction. Since each layer has, for example, an imperfection probability of a few parts per million at any given point, the total junction imperfection is the multiplication of such probabilities in each layer and hence an infinitesimal of higher order such as a few parts in $10^{12}$.

An apertured high resistivity layer of, for example, silicon dioxide may be applied to the target so that electrons which are directed toward regions of the target covered by the silicon dioxide produce no substantial signal output, but rather are collected by the low resistivity layer which acts as a conduction and prevents charge build up on the silicon dioxide.

DESCRIPTION OF THE PREFERRED EMBODIMENTS

Figure 1:
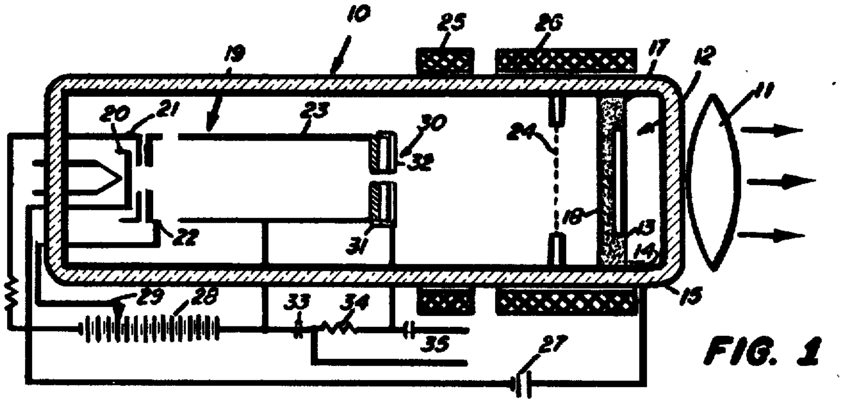
FIG. 1 illustrates a camera pickup tube embodying the invention.
Figure 3:
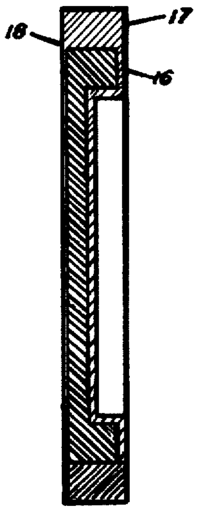
FIG. 3 illustrates a transverse sectional view of the target structure illustrated in FIG. 2 taken along line 33 of FIG. 2.
Figure 2:
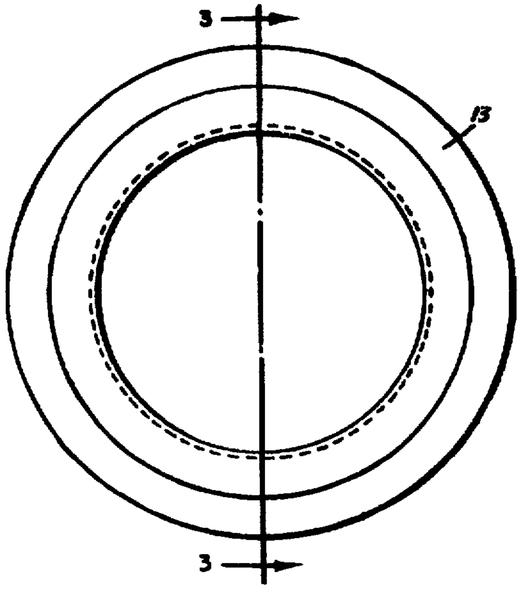
FIG. 2 illustrates an elevation view of the target structure used in FIG. 1.

Referring now to FIGS. 1 through 3, there is shown an embodiment of the invention in which a light camera tube 10 is used as a signal generator to supply output signals to a display cathode ray tube in response to a light image impressed on tube 10 by means of a lens 11. Tube 10 has a target structure, generally shown at 12 and illustrated in greater detail in FIGS. 2 and 3, comprising a disc or semiconductor material 13 held in a metal support ring 14 supported by a glass envelope 15 of tube 10. Semiconductor disc 13 which may have a thickness of, for example, 0.5 mil, has a thin conductive layer 16 on one surface thereof which is substantially transparent to the impinging light picture. Conductive layer 16 extends out to and contacts ring 14 from which an output lead extends through the envelope 15 for connection to external circuitry. Conductive layer 16 may be, for example, a thin layer of tin oxide.

Alternatively, semiconductor body 13, which may be of moderate conductivity doped, for example, with phosporous and having, for example, $10^{19}$ carriers per cubic centimeter, may have layer 16 formed thereon as a more heavily doped layer of the same impurity type semiconductor, having, for example, $10^{21}$ carrier per cubic centimeter. The semiconductor is preferably chosen as N type wherein the photons of light impinging on the body 13 will produce holes with a high efficiency. Positioned on the other side of layer 13 from the layer 16 is a layer 18 of dielectric material which has a bulk resistivity several orders of magnitude larger than the bulk resistivity of the semiconductor layer 13. For example, if the semiconductor layer 13 is of N type semiconductor material having a bulk resistivity of 1 to 20 ohm centimeters, and the high conductents layer 16 of N type material has a bulk resistivity at least one order of magnitude less than that of layer 13, then a layer 18 should have a bulk resistivity in excess of 1000 ohm centimeters. More specifically, layer 18 is preferably made of antimony trisulfide and is preferably between 1000 and 5000 angstroms thick the bulk resistivity is on the order of $10^9$ ohm centimeters and the resistance along the surface, for a layer thickness of 1000 angstroms, is on the order of $10^{14}$ ohms per square centimeter.

The particular materials disclosed are by way of example only, and any dielectric material can be used. In general the resistivity of layer 18 will vary as a nonlinearly as an inverse function of its thickness, and a usable range of thickness, which may be applied by vapor disposition or sputtering, is between the 100 to 10,000 angstrom. While the dielectric material is preferably amorphous and may be polycrystalline, it is preferably not formed of single crystal material in order to achieve the relatively high resistivity. In addition, the material layer 18 is preferably a relatively good carrier of holes and a relatively poor carrier of electrons.

As illustrated herein, the tube 10 has an electron gun structure 19 comprising a cathode 20, a control grid 21, a focusing electrode 22 and an accelerating electrode 23. A decelerating electrode 24 is positioned between the gun 19 and the target 12 and may be, as shown, in the form of a screen or it may be a conductive ring on the envelope 15. A focus coil 25 and deflection coil 26 focus the electron beam on the target 12 and deflect it in accordance with any desired pattern of scan across the target 12 by means of circuits (not shown). Target 12 is maintained slightly positive with respect to the cathode 20 of gun 19 by means of a battery 27 and the accelerating electrode is maintained 1000 volts or more positive with respect to the cathode of battery 28. Focusing electrode 22 is supplied with a suitable positive voltage with respect to the cathode 20 by means of a tap 29 on the battery 28.

In operation, the light pattern impinges on the target 12 and, due to the semiconductor layer 13, generates a substantially greater percentage of carriers for a given amount of light energy than in non-semiconductor targets. The electron beam from the gun 19, having scanned the surface of the layer 18, has produced a voltage charge thereon so that in those regions of the target where the light impinges and carriers are generated, carriers will migrate under the influence of the voltage gradient in the layer 13 across the junction between the layers 18 and 13 to discharge the surface charge in that region of the layer 18 substantially opposite the regions where they were generated so that when the beam again scans that element of the target electrons will be accepted by the surface of the target.

Those elements of the target which are already charged from the previous scan because no carriers were generated by light impingement cause electrons to be reflected from the layer 18 and to impinge substantially on the end of the gun 19 where a semiconductor signal multiplier 30 is positioned. Multiplier 30 consists of a layer of semiconductor material 31 of, for example, N-type material supported by the metal end plate of gun 19. A highly conductive P-layer 32 forms a junction with layer 31 and a back bias is applied across the junction by means of a battery 33 in series with an output load resistor 34. Returning electrons striking the multiplier 30 cause generation of carriers within the semiconductor layer 31 which produces a current flow through the output load resistor 34. The output voltage signal developed across resistor 34 is coupled to a load circuit by means of a coupling capacitor 35.

Because the dielectric layer 18 has a high resistance to current flow in directions parallel to its surface, the charge pattern imposed on the surface of layer 13 by the electron gun is selectively discharged largely by the impinging light pattern and leakage of charges along the surface of layer 18 is maintained at a low value.

From the foregoing, it may be seen that by the use of a single junction having a very substantially greater resistance parallel to the junction than perpendicular to it for one of the layers of the junction a high definition junction type light sensitive target may be produced which has the high photo-electric conversion efficiency of semiconductor materials while still preserving the high definition.

When the layer 18 is made of a material which is photosensitive such as antimony trisulphide, any photons not passing through the semiconductor layer 13 will strike the layer 18 rendering it more conductive and hence aiding discharge of the charge stored by the electron beam on the surface of layer 18.

The layer 18 may be also made of an insulation whose resistance has been lowered by doping such as a layer of silicon dioxide having on the order of 1% boron and having a thickness of 100 to 10,000 angstroms, and it may be amorphous or pollycrystaline silicon suitably doped with any desired p type impurity such as boron.

Figure 4:
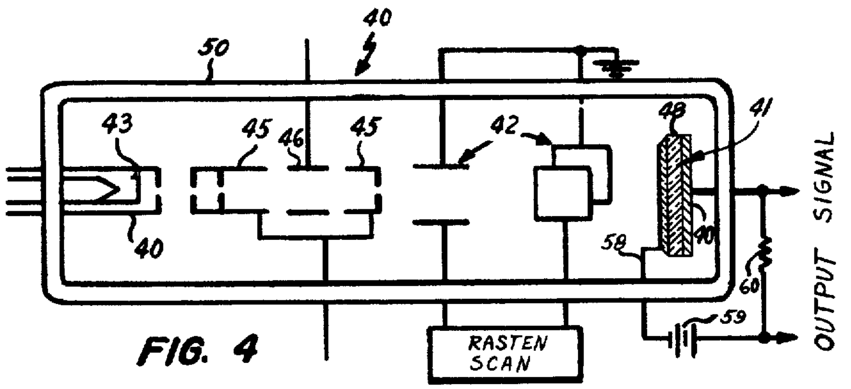
FIG. 4 illustrates a monoscope signal generation system embodying the invention.
Figure 5:
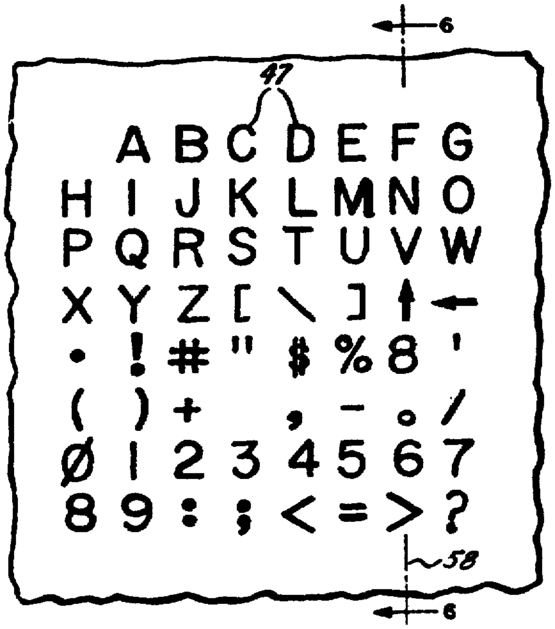
FIG. 5 illustrates a target electrode structure used in FIG. 4.
Figure 6:
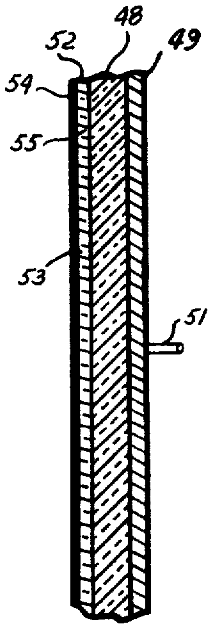
FIG. 6 illustrates a transverse sectional view of the target shown in FIG. 5 taken along line 66 of FIG. 5.

Referring now to FIGS. 4 through 6 there is shown a monoscope tube 40 having a target electrode structure 41, and deflection plates 42 which will produce a scan of the target 41 by an electron beam in accordance with well known practice. The electrons emitted from a cathode 43, are controlled by a grid 44, accellerated by an accellerating electrode structure 45 and a focusing electrode structure 46; all according to well known practice.

As shown in greater detail in FIGS. 5 and 6 there is produced on the target electrode structure 41 a plurality of characters, indicated at 47 in FIG. 5. Target electrode structure 41 consists of a silicon wafer 48 approximately 0.007 to 0.010 inch thick held by a supporting plate 49 attached to the envelope 50 of the monoscope, for example, by a lead in rod 51 extending.

On one surface of silicon wafer 48 is a layer of silicon dioxide 52 which may be, for example, .04 mills thick, and may be produced by any desired means such as subjecting the wafer of silicon to an oxidizing atmosphere at an elevated temperature in accordance with well known practice. The oxide layer has apertures 53, produced by well known photoetching techniques, to expose the unoxidized body of silicon beneath the oxide layer. The shape of such apertures is in the form of the characters 47 whose signal is to be generated by the monoscope.

Deposited over oxide layer 52 is a layer of material 54 from the class of insulators which have a conduction band close to the conduction band of the semiconductor. The layer of insulating material may be, for example, 0.4 microns thick. An aluminum contact layer 550.0002 mils thick is deposited in a layer over an insulating layer 54. The aluminum layer 55 is in contact with an output lead 28. As shown in FIG. 4, a suitable potential is applied between layers 55 and 49 by means of a battery 59 in series with an output load resistor 60. Battery 59, which may be, for example, 15 volts, produces a reverse bias across the junction formed by the layers 48, 54, and 55 such that when carriers are injected into the junction region by high speed bombardment from the electron beam, holes will flow from the semiconductor junction to the aluminum conductor 55 through the insulating layer 54. In the absence of such bombardment, no charge carriers are generated and since the insulating material 54 has a conduction and valance bands substantially different from the conduction and valance bands of the semiconductor material carrier flow, or normal conduction, is negligible.

When the electron beam scans across the target 11 it strikes the conductor layer 55 and the insulating material 54. If it is positioned so that it impinges upon a layer of the oxide 52 all the electrons are captured in this layer and there is no conduction through the target. On the other hand if the electron beam impinges in a region where there is no oxide layer, then the electrons penetrate through the layers 55 and 54 into the junction region in layer 48. The degree of penetration varies, depending on a statistical relationship of the number of collisions encountered by any given electron. Since the number of holes generated in this process is a function of the ionization potential and the initial electron velocity of the impinging beam, a large multiplication of current occurs. For example, if the ionization potential of silicon is 3.6 electron volts, and the beam velocity is equivalent to 1200 volts a theoretical current multiplication in excess of 350 is possible. As a practical matter, a current multiplication of 2000 or more has been achieved.

If the back bias voltage applied across load 30 and the junction is made, for example, 15 volts, a power amplification can be achieved from the device, since the beam input power is about 1.2 milliwatts, while the output power consists of a current approximately 200 times the input current or 200 microamps, and for maximum power transfer the voltage drop across the output load resistor 30 is chosen to be approximately 7½ volts so that the output power of 1.5 milliwatts is a power gain slightly in excess of unity.

By increasing the back bias voltage, which necessitates increasing the thickness of the various layers, a higher power gain can be obtained. However, this is at the sacrifice of some frequency response and for monoscope applications this is normally not necessary since the only requirement is that the output signal be sufficiently above background noise such that an output amplifier may build the signal up to a useful level.

In addition to blocking the electron bombardment of the semiconductor layer 18, oxide layer 23 reduces the total capacitance between the metallic conductors 25 and 26 such that the interelectrode capacitance across the output circuit, which limits the frequency response and hence the maximum rate of scanning of the device, is substantially reduced.

While a device in which the metallic layer directly contacts the semiconductor layer 18 will produce a junction barrier, as a practical matter production defects in this barrier will not render a large surface area junction device uniform throughout its entire area. For example, a device having the equivalent of 10,000 individual spots may have as many as 10 percent imperfections such that a detectable degradiation of signal response in some of the characters will be observed. The insulating layer 24 may also have pin holes through it to the extent of possibly 10% of the usable surface. However, since both the insulating material 24 and metallic layer 25 act as barriers when in contact with the semiconductor material and since the probability of overlap of defects is equal to the multiplication of the percentage of defects of both layers the overall barrier defect will be less than 1%.

Figure 7:
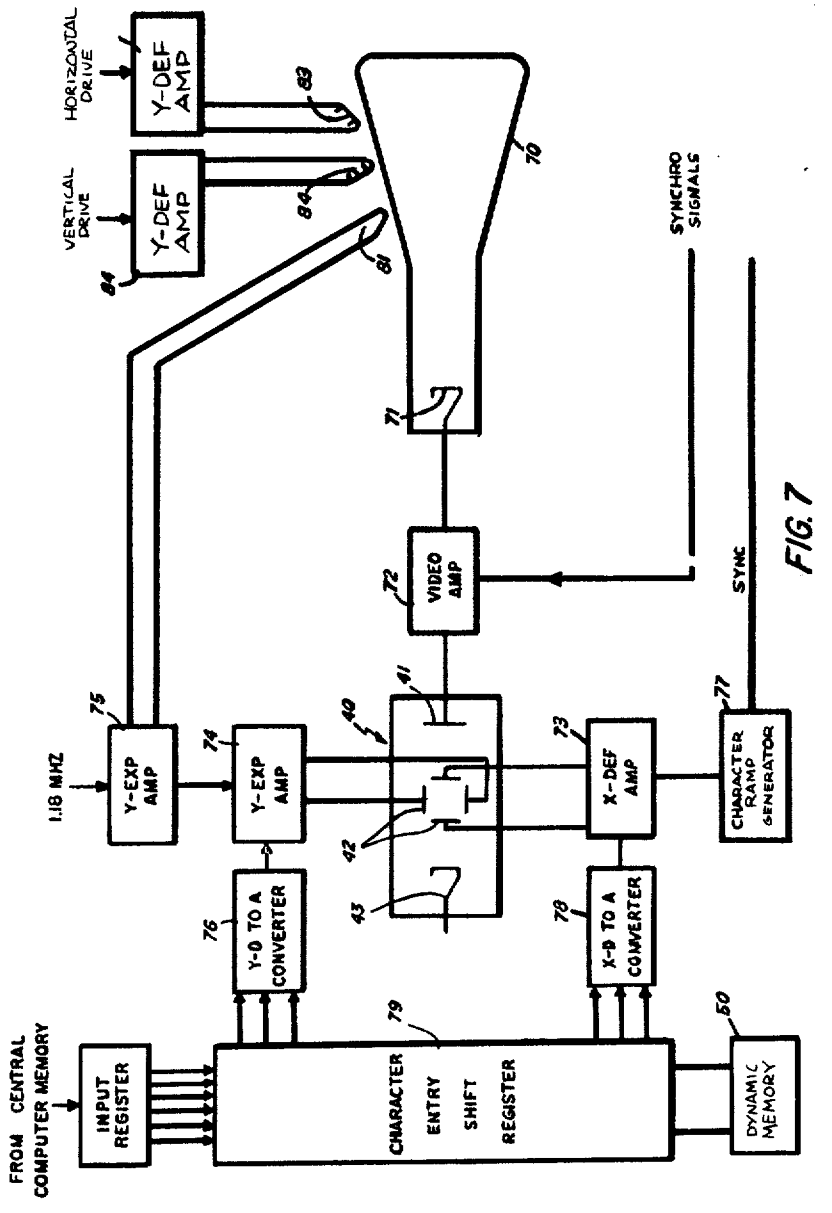
FIG. 7 illustrates a signal display system utilizing the monoscope structure illustrates in FIGS. 4, 5 and 6.

Referring now to FIG. 7 there is shown a digital display system embodying the invention wherein the device of FIGS. 1, 2, and 3 or the device of FIGS. 4, 5 and 6 may be used. A cathode ray tube display device 70 has a cathode 71 driven by a video amplifier 72 whose input is driven by the output of a monoscope 10 having a target electrode 20 and a cathode 12. Horizontal deflection plates 18 are driven by an X deflection amplifier 73 and the Y deflection plates 17 are driven by a Y deflection amplifier 74. The Y deflection amplifier is driven by a Y expansion amplifier 75 driven by a 1.18 megahertz squarewave to vertically scan across each individual character and by a Y-D to A converter 76 which vertically positions the monoscope beam in accordance with digital input signals. The X deflection amplifier is driven by a character ramp generator 77 which generates a deflection across the individual character in response to an input synchronizing signal and is also driven by an X-D to A converter 78 which positions the electron beam in the proper position to scan a character in response to input digital signals. D to A converter 76 and 78 are driven by a character entry shift register 79 which supplies character position information to the monoscope 10 from a dynamic storage memory 80 such that the cathode ray tube 70 will continuously display a raster of information based on digital information stored in the memory 80. Expansion amplifier 75 generates a signal which drives a small excursion deflection coil 81 on the display tube 70 in synchronism with similar excursions of the beam of the monoscope.

The position of the beam on the cathode ray tube 70 is determined by vertical deflection coils 82 and horizontal deflection coils 83 which are driven by a Y deflection amplifier 84 and an X deflection amplifier 85 respectively in accordance with synchronizing input signals to produce a normal television type raster scan of the face of the tube 70. A synchronizing pulse supplied to the video amplifier 72 blanks the amplifier during intercharacter deflection periods such that when the beam is scanned from one character to another noise will not be amplified and appear as bright flashes on the face of the screen. The character ramp generator produces a deflection across the face of the cathode ray tube in synchronization with the monoscope horizontal deflection across the character being scanned.

As illustrated herein successive rasters of information may be displayed on the cathode ray tube 70 by being fed from a central computer memory through an input register 86 to character entry shift register 79 and stored in the dynamic memory 80. The information which represent a raster of character positions is then continuously read by register 79 and fed to monoscope 10 to produce characters which are displayed repetitively on the face of the cathode ray tube 73. The particular details of such a data display system are described in greater detail in the previously mentioned Bryden patent application. In such a system incorporating this invention the output from the target electrode 70 may drive the cathode 71 directly without any amplification by a video amplifier 72 if a sufficiently high voltage is supplied between the cathode 12 and the target 20. For example, good results may be achieved with a monoscope of this invention voltage of 3500 volts and output character signals fed directly to a cathode ray tube will have a clarity and brillance equivalent to those produced by conventional monoscopes with amplifiers including preamplifiers may be achieved.

This completes the description of the embodiment of the invention illustrated herein, however, many modifications thereof will be apparent to persons skilled in the arts without departing from the spirit and scope of this invention. For example, any desired semiconductor material can be used and a wide range of insulating material can be used for the layer 24. Any type of characters or in fact the presence or absence of any characters at all may be modified depending upon the application of the tube. In addition, the device may be used with a simple flood gun rather than a scanning pattern as illustrated herein any any desired mode of scanning may be used. Furthermore, the output load resistor may be placed in other portions of the circuit and other types of support for the target electrode may be used. Accordingly, it is contemplated that this invention embody a wide range of alternatives as defined by the scope of the appended claims.

What is claimed is:

1. In combination:

a solid state junction device comprising a plurality of layers of different materials forming a substantially unidirectionally conductive junction at their interface;

a first of said layers comprising semiconductor material;

a second of said layers comprising a compound having a bulk resistivity which is substantially greater than the bulk resistivity of said first layer;

the resistance per unit area through said second layer in a direction normal to said junction being substantially less than the resistance per unit area through said semiconductor layer;

means for producing a voltage bias across said junction; and means for injecting charge carriers into the region of said junction.

2. A combination in accordance with claim 1 in which said semiconductor layer comprises silicon and said second layer comprises a metal compound forming a unidirectional junction with said silicon.

3. A combination in accordance with claim 1 wherein said means for producing a voltage bias across said junction comprises an evacuated envelope containing an electron source and means for directing electrons from said source toward said plurality of layers.

4. A combination in accordance with claim 1 wherein an apertured third layer is positioned between said first and second layers with said second layer contacting said first layer and forming said junctions with said first layer in said apertures.

5. A combination in accordance with claim 4 wherein the surface of said first layer on the opposite side of said first layer from said second layer has a bulk resistance substantially lower than the average bulk resistance of said first layer.

6. In combination:

a multilayer body comprising a first layer of semiconductor material and a second layer of material which is different from the material of said first layer supported on said first layer and forming a unidirectionally conductive junction at the interface of said second layer with said first layer;

means for producing a voltage bias across said junction; and means for producing charge carriers in said first layer.

7. A combination in accordance with claim 6 wherein said first layer comprises silicon.

8. A combination in accordance with claim 1 wherein said semiconductor layer has a surface region on the opposite side thereof from said second layer which has a resistance at least one order of magnitude less than the resistance of said semiconductor layer.

9. A combination in accordance with claim 8 wherein said semiconductor layer has a surface region on the opposite side of said layer from said second layer which has a carrier concentration at least one order of magnitude greater than the average carrier density of said semiconductor layer.

10. A combination in accordance with claim 6 wherein the average bulk resistance of said first layer of semiconductor material is at least one order of magnitude less than the average bulk resistance of said second layer of said metal compound.

11. In combination:

a first layer of semiconductor material;

a second layer of substantially insulating material formed on said semiconductor layer and having apertures therein;

a third layer contacting said first semiconductor layer through said apertures, said third layer being formed of a material having a higher bulk resistance than the average bulk resistance of said first layer;

means for producing a reverse bias across the junction regions produced between said first semiconductor layer and said third layer in said apertures in said second layer; and means for producing charge carriers in said first layer.

12. A combination in accordance with claim 11 wherein said first layer comprises silicon, said second layer comprises a compound of silicon including oxygen, and said third layer comprises a metallic compound.

13. A semiconductor target for an image pickup tube comprising an insulating layer formed of silicon oxide mounted on a portion of one side of the substrate with another portion of said one side of said substrate exposed, and a semi-insulating layer having a resistivity of between about $10^8$ and $10^{10}$ ohm cm. on the exposed portion of the substrate and defining a junction for storing charges therewith, said semi-insulating layer also being on the insulating layer and forming a resistive sea.

14. In combination:

a solid state junction device comprising a plurality of layers of different materials forming a substantially unidirectionally conductive junction at their interface;

a first of said layers comprising semiconductor material;

a second of said layers comprising a compound having a bulk resistivity which is substantially greater than the bulk resistivity of said first layer;

said bulk resistivity of said second layer being between $10^8$ and $10^{10}$ ohm-centimeters;

means for producing a voltage bias across said junction; and means for injecting charge carriers into the region of said junction.

15. A combination in accordance with claim 14 wherein said means for producing a voltage bias across said junction comprises an evacuated envelope containing an electron source and means for directing electrons from said source toward said plurality of layers.

16. A target for a cathode ray tube comprising:

a semiconductor body;

a first layer comprising insulating material having a plurality of apertures therein supported on a surface of said semiconductor body; and a plurality of barrier junctions formed in said apertures with said surface of said semiconductor body;

said junctions comprising portions of a second layer of material having a resistivity between $10^8$ and $10^{10}$ ohm-centimeters extending over at least a plurality of said apertures and the intervening portions of said first layer between said apertures.

17. A target in accordance with claim 16 wherein said semiconductor substrate comprises silicon.

18. A target in accordance with claim 17 wherein said insulating layer comprises a compound of silicon.

19. A target in accordance with claim 17 wherein said apertured layer is silicon dioxide.

20. A target in accordance with claim 16 wherein said third layer comprises antimony trisulfide.

21. A semiconductor target for a cathode ray tube comprising:

a semiconductor substrate having an insulating layer of silicon dioxide mounted on a portion of one side of said substrate with a plurality of other portions of said substrate exposed and a layer comprising material having a resistivity of between about $10^8$ and $10^{10}$ ohm-centimeters forming junctions with said exposed portions of said substrate for storing charges therewith, said layer extending continuously across said insulating layer between said junctions.

22. A semiconductor target for a cathode ray tube comprising:

a single crystal semiconductor substrate supporting a semiinsulating layer having a resistivity of between about $10^8$ and $10^{10}$ ohm-centimeters on one side of said substrate and defining a junction for storing charges therewith.

23. An image pickup tube comprising:

a target having a single crystal semiconductor substrate for producing charge carriers in response to radiation incident on said target through one surface thereof; and a junction on the opposite surface of said semiconductor substrate for storing charges produced by a scanning electron beam of said tube and discharged in accordance with the intensity of said radiation produced in said semiconductor substrate;

said junction comprising a layer of material having a bulk resistivity of between about $10^8$ and $10^{10}$ ohm-centimeters supported on, and extending substantially across, the surface of said semiconductor substrate scanned by said electron beam, the thickness of said layer being substantially less than the thickness of said semiconductor substrate.

* * * * *